United States Patent [19]

Cooper

[11] Patent Number: 5,352,627
[45] Date of Patent: Oct. 4, 1994

[54] MONOLITHIC HIGH VOLTAGE NONLINEAR TRANSMISSION LINE FABRICATION PROCESS

[76] Inventor: Gregory A. Cooper, 346 Primrose Dr., Pleasant Hill, Calif. 94523

[21] Appl. No.: 58,369

[22] Filed: May 10, 1993

[51] Int. Cl.⁵ .......................................... H01L 21/203
[52] U.S. Cl. .................... 437/105; 437/107; 437/126; 437/133; 437/128; 437/129; 333/20; 257/274; 257/480
[58] Field of Search ............... 437/104, 105, 107, 126, 437/129, 128, 133; 333/20; 257/275, 480

[56] References Cited

U.S. PATENT DOCUMENTS

| | | | |
|---|---|---|---|
| 4,126,928 | 1/1979 | Logan et al. | 437/126 |
| 4,956,568 | 9/1990 | Su et al. | 333/20 |
| 5,014,018 | 5/1991 | Rodwell et al. | 333/20 |
| 5,214,318 | 5/1993 | Nakanishi et al. | 333/20 |
| 5,254,492 | 10/1993 | Tserng et al. | 437/126 |
| 5,256,996 | 10/1993 | Marsland et al. | 333/20 |
| 5,278,444 | 1/1994 | Lieneweg et al. | 257/480 |

FOREIGN PATENT DOCUMENTS

| | | | |
|---|---|---|---|
| 5690505 | 7/1981 | Japan | 257/480 |
| 2299274 | 12/1990 | Japan | 257/480 |

*Primary Examiner*—R. Bruce Breneman
*Assistant Examiner*—Ramamohan R. Paladugu
*Attorney, Agent, or Firm*—Henry P. Sartorio; Daryl S. Grzybicki

[57] ABSTRACT

A process for fabricating sequential inductors and varactor diodes of a monolithic, high voltage, nonlinear, transmission line in GaAs is disclosed. An epitaxially grown laminate is produced by applying a low doped active n-type GaAs layer to an n-plus type GaAs substrate. A heavily doped p-type GaAs layer is applied to the active n-type layer and a heavily doped n-type GaAs layer is applied to the p-type layer. Ohmic contacts are applied to the heavily doped n-type layer where diodes are desired. Multiple layers are then either etched away or Oxygen ion implanted to isolate individual varactor diodes. An insulator is applied between the diodes and a conductive/inductive layer is thereafter applied on top of the insulator layer to complete the process.

24 Claims, 2 Drawing Sheets

– 5,352,627 –

MONOLITHIC HIGH VOLTAGE NONLINEAR TRANSMISSION LINE FABRICATION PROCESS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The invention relates to a process for fabrication of a monolithic nonlinear transmission line semiconductor integrated circuit (IC). In particular, the invention discloses a novel process for fabrication of Gallium Arsenide (GaAs) varactor diodes and low parasitic capacitance lumped inductors used to interconnect the diodes in a monolithic nonlinear transmission line.

2. Description of Related Art

In a typical nonlinear transmission line, the combined and summed capacitive and inductive effect on a pulse traveling down the transmission line will decrease the transition time of the voltage step of the pulse which propagates down the line. Individually grouping or lumping discrete capacitive, resistive, and inductive components in a circuit will synthetically and electronically reproduce the same effect. Such lumped nonlinear transmission lines have been engineered and utilized to make application of the pulse shortening effect to generate very short, high-voltage pulses by all electronic means. Indeed, lumped nonlinear transmission lines are customarily used to decrease the transition time of the voltage step of a pulse which propagates down a synthetic transmission line.

Existing art nonlinear lumped transmission lines, however, exist in large part in the form of a synthesis of discrete components. Numerous attempts have been made to integrate such components into smaller and smaller packages with a characteristic impedance which is matched to the circuits to which the pulse shaping circuit is connected. Other attempts to make a single piece integrated circuit of all necessary components have been restructed to low voltage applications only. The invention disclosed herein therefore attempts to meet a long standing need for conveniently and efficiently making and manufacturing in great numbers high quality and highly efficient monolithic lumped high voltage, nonlinear transmission lines.

It will be understood that the invention process disclosed herein relates specifically to the process for fabricating a monolithic high voltage nonlinear transmission line and not the circuit design thereof. Other prior art devices have been conceived for low voltage nonlinear transmission lines for electrical pulse compression; however the novelty or the invention process disclosed herein is in the ability to fabricate a high voltage nonlinear transmission line, which by the inherent nature thereof carries a broader range of application than its lower voltage counterpart.

SUMMARY OF THE INVENTION

It is therefor a primary object of the invention to provide a new and improved, novel process for fabricating a monolithic high voltage lumped, nonlinear transmission line integrated circuit.

Another object is to provide a process for fabricating an integrated circuit high-voltage (10 V–200 V) nonlinear transmission line using Gallium Arsenide (GaAs) varactor diodes to yield the voltage dependent and desired diminishing, capacitive effect per stage in a lumped, nonlinear transmission line.

Yet another object is to provide a process for fabrication of a nonlinear transmission line which includes the fabrication of varactor diodes in communication with low parasitic capacitance lumped inductors for linking the diodes.

A further object is to provide a process for fabrication of a high voltage nonlinear transmission line that has a broader range of application than prior art low voltage transmission lines.

These and other advantageous, features and benefits of the invention will become more readily understood and apparent in view of the drawings as explained in the specification, and as interpreted and limited by the appended claims.

The invention is a process for fabrication of a monolithic high voltage nonlinear transmission line by first epitaxially growing a thick, low doped active n-type layer on an n-plus GaAs substrate, then epitaxially growing a heavily doped p-type GaAs layer on the n-type layer, then epitaxially growing a heavily doped n-type GaAs layer on the p-type layer, followed by forming ohmic contacts on the GaAs n-type layer, thence either etching away the n and p type layers around varactor diodes or ion implanting oxygen atoms in said layers to electrically isolate the diodes, next depositing a thick polyimide layer to electrically isolate inductors from the GaAs substrate, then etching away the polyimide layer above the ohmic contacts, and finally electroplating a layer of thick gold to form an inductor layer on the polyimide layer.

DETAILED DESCRIPTION OF THE INVENTION

Figure 1:
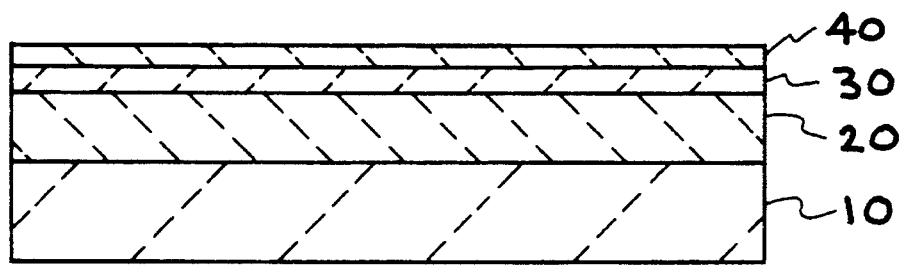
FIG. 1 illustrates the deposition of the first four layers and the first four basic steps of the process.

FIG. 1 depicts a cross sectional, elevational view of the lamination structure of the four primary laminae of a section of a monolithic, high voltage nonlinear, transmission line structure fabricated by the process disclosed herein. The invention disclosed relates only to the process of fabrication, however, and not to the apparatus, structure or components shown in the drawings.

The fabrication process begins as illustrated in FIG. 1 with a thin and planar n-plus-type Gallium Arsenide (GaAs) substrate 10 which is heavily Silicon (Si) doped in the realm of $2 \times 10^{18}/cm^3$. Substrate 10 may be in the realm of 400 microns in thickness or of any thickness that will give adequate support and strength to the monolithic structure on completion. The fabrication process proceeds in the following manner:

Step 1: A relatively thick, low doped, active, n-type GaAs lamina 20 is epitaxially grown on substrate 10. Low doped n-type lamina 20 is Si doped in the realm of $6.4 \times 10^{15}/cm^3$ and is approximately 5 microns in thickness. It is of substantial importance that the dopant applied to high doped lamina 20 is not necessarily constant; doping may be hyper abrupt or lowly doped, and may alternatively be flat or abruptly doped. In addition, the dopant in lamina 20 may also be nonhomogeneously applied throughout lamina 20. In either event, the effect and outcome will vary the capacitive nature of the lamina.

Step 2: A highly doped p-type GaAs lamina 30 is next epitaxially grown on low doped n-type lamina 20. High doped p-type lamina 30 is Beryllium (Be) doped in the realm of $1 \times 10^{18}/cm^3$ and is approximately 0.2 microns (2000 Angstroms) thick.

Step 3: A highly doped n-type GaAs lamina 40 is then epitaxially grown on high doped p-type lamina 30. In a similar manner as with lamina 30, high doped n-type lamina 40 is Si doped in the realm of $1 \times 10^{18}/cm^3$ and is somewhat thicker than lamina 30 at approximately 0.5 microns (5000 Angstroms) in thickness.

Figure 2:
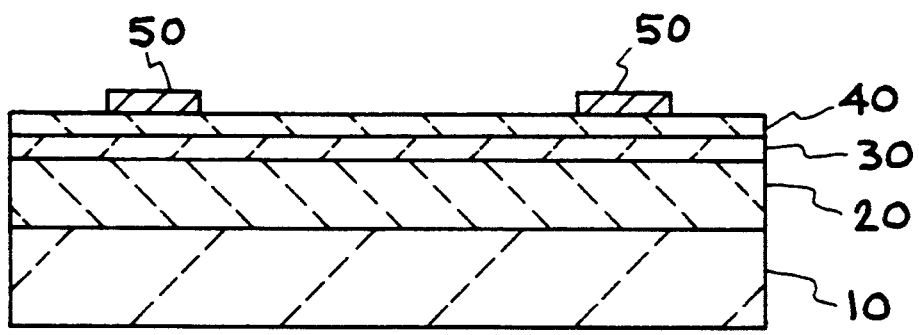
FIG. 2 illustrates the fifth step of deposition of the ohmic contact.

Step 4: Referring now to FIG. 2, ohmic contacts 50 are applied to the surface of high doped n-type lamina 40 by conventional mask means and vapor deposition or sputtering processes confined to areas where individual varactor diodes are to be formed. Thickness is of nominal concern, but preferably in the realm of 0.1 microns.

Figure 3:
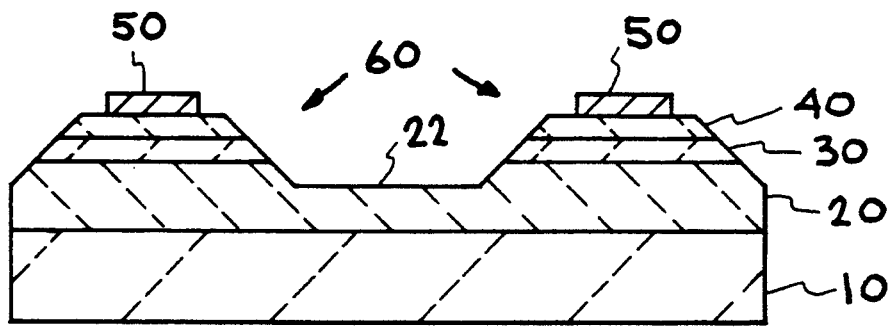
FIG. 3 depicts the sixth step for etching away portions of n and p layers to isolate the varactor diodes.
Figure 4:
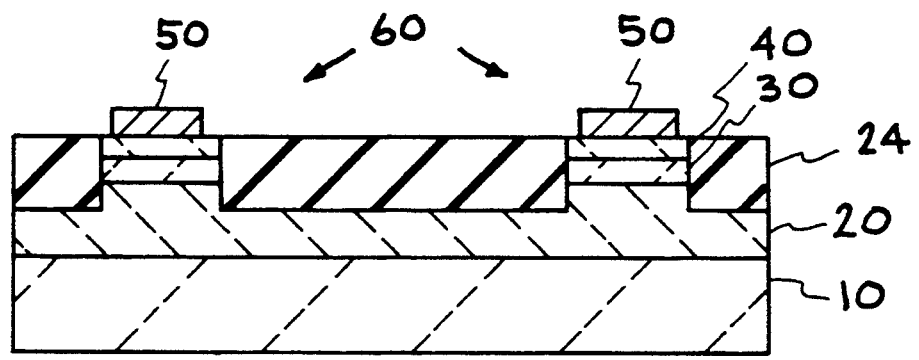
FIG. 4 depicts the alternate sixth step for oxygenating the n and p layers to isolate the varactor diodes.

Step 5: Referring now to FIGS. 3 and 4, individual islands of varactor diodes 60 are created by one of two alternative methods. FIG. 3 illustrates a conventional mask and etching away process which is used in the preferred embodiment to deactivate by excising defined volumes, sectors, or areas of high doped n and p-type laminae 40 and 30, as well as a portion of low doped n-type lamina 20. A portion 22 of lamina 20 may be left on substrate 10 in solid state electronic continuity with other varactor diodes 60 as part of the interconnecting conductor-inductor circuit between islets of varactor diodes 60. FIG. 4 illustrates an alternative method for creating electronically isolated varactor diodes 60 on substrate 10. In the method of FIG. 4, defined portions of high doped n and p-type laminae 40 and 30 as well as a portion of low doped n-type lamina 20 are deactivated by Oxygen ion implantation therein, which effectively converts the designated volumes, areas, or sectors between varactor diodes 60 of semiconductor laminae 40, 30, and a portion of 20 into a single insulator layer 24.

Figure 5:
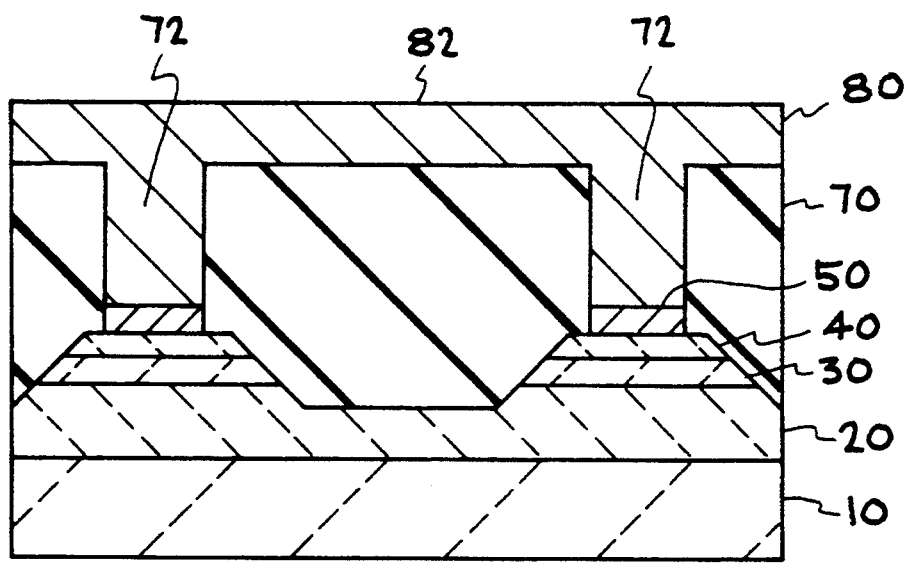
FIG. 5 illustrates the final steps 7, 8, and 9, and a cross section of the final monolithic high voltage nonlinear transformer wherein diode isolation was accomplished by the etching procedure.
Figure 6:
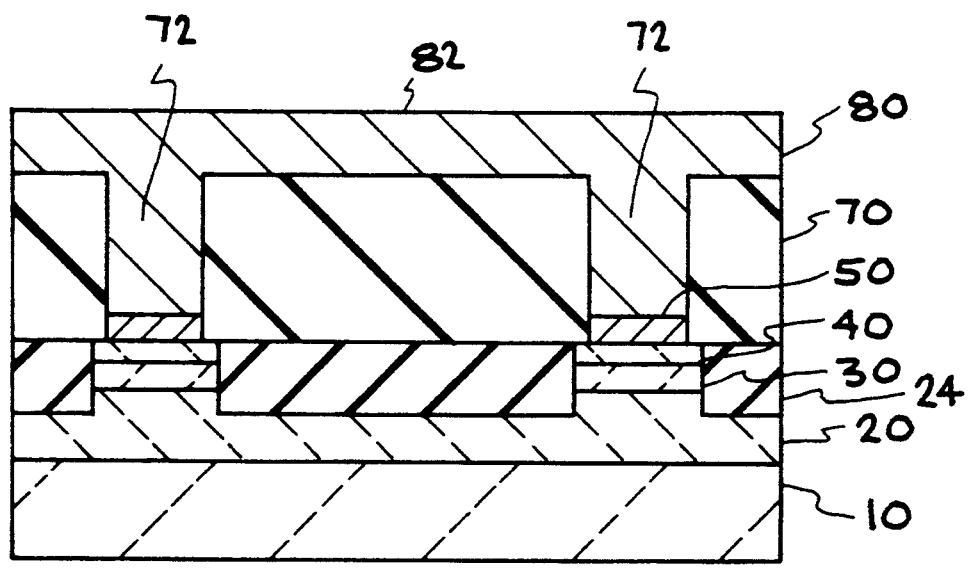
FIG. 6 illustrates the final steps 7, 8, and 9, and a cross section of the final monolithic high voltage nonlinear transformer wherein diode isolation was accomplished by Oxygen ion implantation.

Step 6: Referring now to FIGS. 5 and 6, a 20 micron thick insulator layer 70 (measured from top surface of layer 40) is applied to the volumes between diode islets 60 leaving the volumes 72 above ohmic contacts 50 open. In the preferred embodiment, insulator layer 70 is a polyimide, but it will be appreciated that any suitable insulator may likewise be utilized.

Step 7: Again, FIGS. 5 and 6, illustrate the final step of adding the inductor layer. A conductor-inductor lamina 80 is applied with a 10 micron thick Gold (Au) plating on the uppermost surface of insulator layer 70, filling in contact volumes 72 and making electronic continuity contact with ohmic contacts 50. Application of Au layer 80 may be accomplished by conventional electroplating processes. Conductor sections 82 between diode elements 60 function as the inductor segments of the circuit to complete the monolithic, high voltage, nonlinear transmission circuit.

Although the foregoing process is described in detail as an enabling embodiment, it will be understood that the disclosed invention is not limited to the above procedural steps, elements or substances inclusively, but is intended to be limited and defined only by the following claims as interpreted by the above description in view of the drawings.

I claim:

1. A process for fabricating a monolithic, high voltage, nonlinear transmission line, comprising the steps of:
    a. epitaxially growing a low doped, active, n-type layer on a heavily doped, n-plus-type substrate;
    b. epitaxially growing a heavily doped, p-type layer on said low doped, active, n-type layer;
    c. epitaxially growing a heavily doped, n-type layer on said heavily doped, p-type layer;
    d. making ohmic contacts on said heavily doped, n-type layer, thereby forming a laminated varactor diode;
    e. deactivating a designated volume of portions of each said heavily doped n-type and p-type layers and said low doped, active, n-type layer in a manner to leave independent and electrically isolated islands of laminated varactor diodes with a remaining portion of said low doped, active, n-type layer in common;
    f. depositing a nonactive and nonconductive layer within and upon said designated volume enclosing said deactivated n- and p-type layers, exclusive of the volumes above said ohmic contacts; and
    g. depositing a conductive layer on said nonconductive layer including and filling said volumes above said ohmic contacts.

2. A process for fabricating a monolithic, high voltage, nonlinear transmission line according to claim 1, wherein said heavily doped, n-plus type substrate of step (a) is Gallium Arsenide (GaAs).

3. A process for fabricating a monolithic, high voltage, nonlinear transmission line according to claim 2, wherein said dopant in said n-plus type substrate is Silicon (Si).

4. A process for fabricating a monolithic, high voltage, nonlinear transmission line according to claim 3, wherein said substrate dopant is approximately $2 \times 10^{18}/cm^3$.

5. A process for fabricating a monolithic, high voltage, nonlinear transmission line according to claim 1, wherein said low doped, active, n-type layer of step (a) is GaAs.

6. A process for fabricating a monolithic, high voltage, nonlinear transmission line according to claim 5, wherein said active n-type dopant is Si.

7. A process for fabricating a monolithic, high voltage, nonlinear transmission line according to claim 6, wherein said active n-type dopant is approximately $6.4 \times 10^{15}/cm^3$.

8. A process for fabricating a monolithic, high voltage, nonlinear transmission line according to claim 7, wherein said low doped, n-type layer is approximately 5 microns thick.

9. A process for fabricating a monolithic, high voltage, nonlinear transmission line according to claim 8, wherein said n-type dopant is non homogeneously distributed throughout said low doped, n-type layer.

10. A process for fabricating a monolithic, high voltage, nonlinear transmission line according to claim 1, wherein said heavily doped, p-type layer of step (b) is GaAs.

11. A process for fabricating a monolithic, high voltage, nonlinear transmission line according to claim 10, wherein said p-type dopant is Beryllium (Be).

12. A process for fabricating a monolithic, high voltage, nonlinear transmission line according to claim 11, wherein said p-type dopant is approximately $1 \times 10^{18}/cm^3$.

13. A process for fabricating a monolithic, high voltage, nonlinear transmission line according to claim 12, wherein said heavily doped, p-type layer is approximately 0.2 microns thick.

14. A process for fabricating a monolithic, high voltage, nonlinear transmission line according to claim 1, wherein said heavily doped, n-type layer of step (c) is GaAs.

15. A process for fabricating a monolithic, high voltage, nonlinear transmission line according to claim 14, wherein said n-type dopant is Si.

16. A process for fabricating a monolithic, high voltage, nonlinear transmission line according to claim 15, wherein said n-type dopant is approximately $1 \times 10^{18}/cm^3$.

17. A process for fabricating a monolithic, high voltage, nonlinear transmission line according to claim 16, wherein said heavily doped n-type layer is approximately 0.5 microns thick.

18. A process for fabricating a monolithic, high voltage, nonlinear transmission line according to claim 1, wherein said ohmic contacts of step (d) are formed by metal deposition on said heavily doped, n-type layer.

19. A process for fabricating a monolithic, high voltage, nonlinear transmission line according to claim 1, wherein said deactivating process of step (e) consists of etching away of said designated volume.

20. A process for fabricating a monolithic, high voltage, nonlinear transmission line according to claim 1, wherein said deactivating process of step (e) consists of implantation of Oxygen ions in said designated volume.

21. A process for fabricating a monolithic, high voltage, nonlinear transmission line according to claim 1, wherein said nonconductive layer of step (f) is a polyimide.

22. A process for fabricating a monolithic, high voltage, nonlinear transmission line according to claim 19, wherein said nonconductive layer is approximately 20 microns thick.

23. A process for fabricating a monolithic, high voltage, nonlinear transmission line according to claim 1, wherein said conductive layer of step (g) is Gold (Au).

24. A process for fabricating a monolithic, high voltage, nonlinear transmission line according to claim 21, wherein said conductive layer is approximately 10 microns thick.

* * * * *